United States Patent [19]

Yagi et al.

[11] Patent Number: 4,586,544
[45] Date of Patent: May 6, 1986

[54] DEVICE FOR CUTTING AND BENDING LEAD WIRES

[75] Inventors: Hiroshi Yagi; Yoshio Harada; Tetsuro Ito, all of Tokyo, Japan

[73] Assignee: TDK Corporation, Tokyo, Japan

[21] Appl. No.: 628,834

[22] Filed: Jul. 9, 1984

[30] Foreign Application Priority Data

Aug. 1, 1983 [JP] Japan .......................... 58-118617[U]

[51] Int. Cl.$^4$ .............................................. B21F 1/00
[52] U.S. Cl. .................................. 140/105; 29/566.3; 29/741
[58] Field of Search .................. 140/105, 106; 29/741, 29/566.3, 566.4, 564.6, 564.7, 564.8; 72/385, 387

[56] References Cited

U.S. PATENT DOCUMENTS 3,429,170  2/1969  Romeo ................................ 29/741
3,986,533  10/1976  Woodman, Jr. .................. 140/105
4,165,557  8/1979  Taguchi et al. .................... 140/105

Primary Examiner—Lowell A. Larson
Attorney, Agent, or Firm—Frishauf, Holtz, Goodman & Woodward

[57] ABSTRACT

A device for cutting lead wires of an electronic circuit element mounted on a printed circuit board into a desired length and for bending the lead wires to be close to the bottom surface of the printed circuit board is capable of dealing with an electronic circuit element having three lead wires as well as that having two lead wires. The device comprises a fixed block having a stationary blade which has two side holes and a central hole formed therethrough, a pair of side levers having laterally movable blade members which are slidable on the surface of the stationary blade to cut and bend lead wires inserted through the side holes of the stationary blade, and a central lever having a movable blade member which are slidable on the surface of the statonary blade to cut and bend a lead wire inserted through the central hole of the stationary blade.

5 Claims, 10 Drawing Figures

DEVICE FOR CUTTING AND BENDING LEAD WIRES

BACKGROUND OF THE INVENTION

1. Field of the Invention

This invention relates to a device for cutting and bending lead wires, and more particularly to a device for cutting lead wires of an electronic circuit element mounted on a printed circuit board into a desired length and bending the lead wires to be close to the bottom surface of the printed circuit board.

2. Description of the Prior Art

Recently, a device for automatically carrying out the cutting and bending of lead wires of an electronic circuit element mounted on a printed circuit board has been proposed with the advance of the techniques of automatically mounting such an electronic circit element on a printed circuit board. However, such a conventional device used in the art is generally adapted to carry out the cutting and bending operation with respect to only electronic circuit elements having two lead wires such as a condenser, a resistor and the like. Thus, it is highly desired that an automatic device is developed which is capable of carrying out the cutting and bending operation with respect to an electronic circuit element having three lead wires as well as that having two lead wires.

SUMMARY OF THE INVENTION

It is therefore an object of the present invention to provide a device for cutting and bending lead wires which is capable of effectively carrying out the cutting and bending operation with respect to an electronic circuit element having three lead wires as well as that having two lead wires.

It is another object of this invention to provide a device for cutting and bending lead wires which is capable of carrying out the cutting and bending operation with a simple construction.

It is still another object of this invention to provide a device for cutting and bending lead wires which is capable of carrying out the cutting and bending operation with good reliability.

In accordance with this invention, there is provided a device for cutting and bending lead wires comprising a fixed block having a stationary blade provided at the distal end thereof, said stationary blade having two side holes and a central hole interposed between said side holes formed therethrough; a pair of side levers each having a laterally movable blade member provided at the distal end thereof, said blade member being slidable on the surface of said stationary blade to cut and bend lead wires inserted through said side holes of said stationary blade; and a central lever having a central movable blade member provided at the distal end thereof, said central movable blade member being slidable on the surface of said stationary blade to cut and bend a lead wire inserted through said central hole of said stationary blade.

Also, in accordance with this invention, there is provided a device for cutting and bending lead wires comprising a fixed block fixedly mounted on a main shaft arranged to be linearly reciprocated and having a stationary blade provided at the distal end thereof; said stationary blade having two side holes and a central hole interposed between said side holes formed therethrough; a pair of side levers connected at one end thereof to said main shaft so as to be slidable with respect to said main shaft and pivotally mounted on said fixed block, said side levers each having a laterally movable blade member provided at the other end thereof and which is slidable on the surface of said stationary blade in the direction along a row of said holes to cut and bend lead wires inserted through said side holes of said stationary blade; and a central lever connected at one end thereof to said main shaft so as to be slidable with respect to said main shaft and pivotally mounted on said fixed block and having a central movable blade member provided at the other end thereof which is slidable on the surface of said stationary blade in the direction across said row of said holes to cut and bend a lead wire inserted through said central hole of said stationary blade.

BRIEF DESCRIPTION OF THE DRAWINGS

Other objects and many of the attendant advantages of the present invention will be readily appreciated as the same becomes better understood by reference to the following detailed description when considered in connection with the accompanying drawings, in which like reference numerals designate the same parts throughout the Figures and wherein.

DETAILED DESCRIPTION

Figure 1:
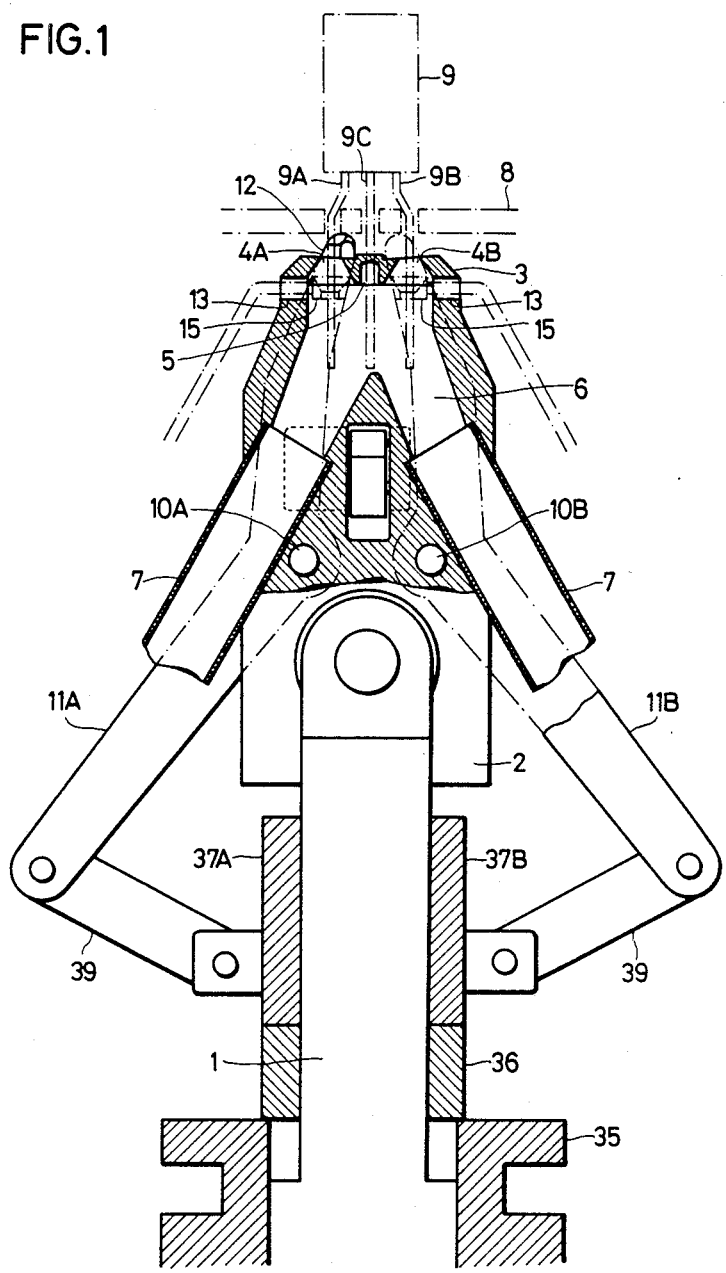
FIG. 1 is a front elevation view partly in section showing an embodiment of a device for cutting and bending lead wires according to the present invention wherein side levers take a position of carrying out the outward bending of lead wires.

FIGS. 1 to 4 illustrate an embodiment of a device for cutting and bending lead wires according to the present invention. The illustrated embodiment includes a main shaft 1 having a block 2 fixed thereon. The fixed block 2 is provided at the distal end thereof with a stationary blade 3. The blade 3, as shown in FIG. 5, is formed with a pair of side holes 4A and 4B and a central hole 5 interposed therebetween. The holes 4A, 4B and 5 are arranged to allow three lead wires 9A, 9B and 9C of an electronic circuit element 9 mounted on a printed circuit board 8 to be inserted therethrough. The inner surface portion of each of the holes 4A, 4B and 5 which acts to cut a lead wire is formed to have an acute angle with respect to the surface of the blade 3 to facilitate the cutting. The fixed block 2 is formed therein with a hollow portion or passage means 6 of a substantially inverted Y-shape which communicates at the upper end thereof with the side holes 4A and 4B and the central hole 5 and is connected at each of the lower ends thereof to a pipe 7 for discharging lead wire chips to the exterior.

Figure 6:
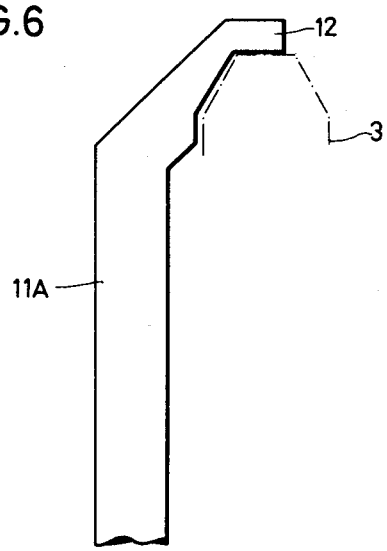
FIG. 6 is a side elevation view showing a side lever.
Figure 7:
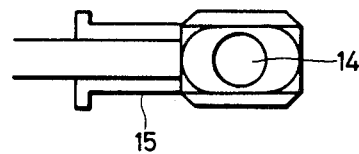
FIG. 7 is a plan view showing a detecting terminal.

The device of the illustrated embodiment also includes a pair of side levers 11A and 11B pivotally mounted on both sides of the fixed block 2 by means of pins 10A and 10B. The side levers 11A and 11B, as shown in FIG. 6, each have a movable blade member 12 mounted on the distal end thereof and are adapted to allow the blade members to be moved in the lateral direction to carry out the cutting and bending the lead wires 9A and 9B of the electronic circuit element 9 positioned in the side holes 4A and 4B, respectively. In the illustrated embodiment, the movable blade members 12, as shown in FIG. 6, each comprise a member formed into a bent roof-like shape to be slided on the surface of the blade 3.

The fixed block 2 is also formed at both sides of the upper portion thereof with a pair of lateral holes 13. The lateral holes 13 are adapted to allow detecting terminals 15 to be inserted thereinto each of which is formed with a hole 14 for inserting the lead wire 9A (9B) thereinto. The detecting terminals 15 are positioned to permit the free ends of the lead wires 9A and 9B inserted through the side holes 4A and 4B to be inserted into the holes 14, respectively. Such construction allows the short-circuit between the terminals 15 and the levers 11A and 11B to be carried out by lead wires when the lead wires are to be cut, to thereby detect an electronic circuit element to be subjected to the cutting and bending operation.

Figure 2:
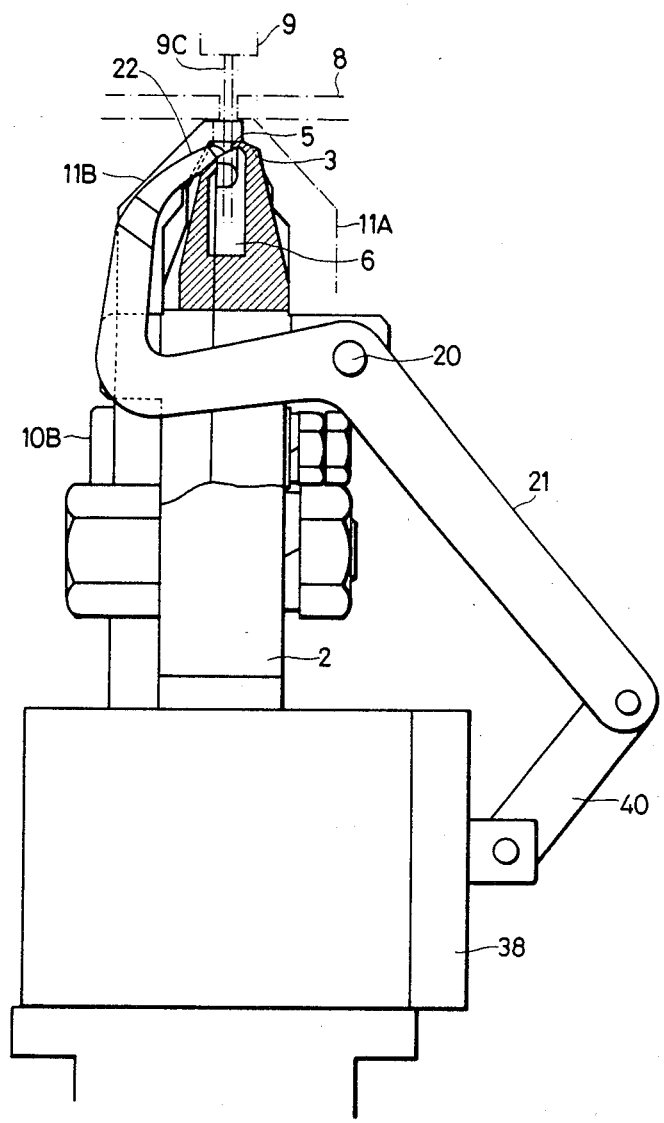
FIG. 2 is a side elevation view partly in section of the device shown in FIG. 1.

The lead wire cutting and bending device of the illustrated embodiment, as shown in FIG. 2, further includes a central lever 21 pivotally mounted by means of a pin 20 on the surface of the fixed block 2 perpendicular to the side surfaces thereof on which the side levers 11A and 11B are mounted. The central lever 21 has a central movable blade member 22 provided at the distal end thereof which acts to cut and bend the lead wire 9C inserted through the central hole 5. In the illustrated embodiment, the central blade member 22 is adapted to be slided on the fixed blade 3 in the direction across the longitudinal direction of the fixed blade 3 or the direction extending from the hole 4A to the hole 4B.

Figure 3:
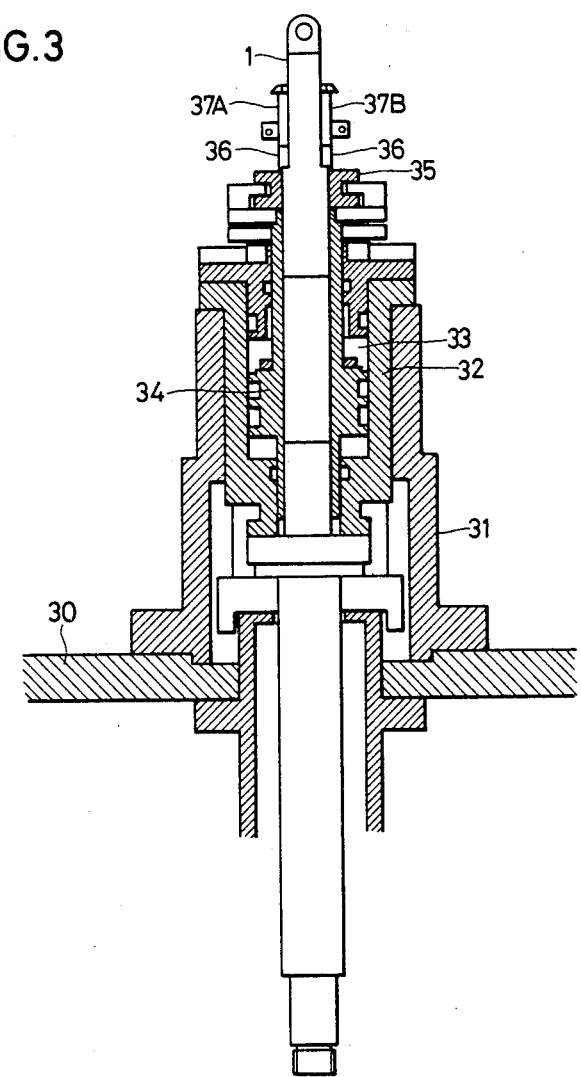
FIG. 3 is a sectional front elevation view showing the essential part of the device shown in FIG. 1.

The main shaft 1 is arranged to be vertically movable with respect to a supporting base 30, as shown in FIG. 3. More particularly, on the base 30 is fixed an outer cylindrical member 31 is fixedly mounted on the base 30. An inner cylindrical member 32 fixed on the main shaft 1 is slidably fitted within outer cylindrical member 31. The inner cylindrical member 32 acts a hollow cylinder 33 in which a piston 34 fitted on the main shaft 1 is received. The movement of the piston 34 is transmitted through vertically sliding members 35 and 36 slidably fitted on the main shaft 1 to brackets 37A and 37B for the side levers 11A and 11B and a bracket 38 (FIG. 2) for the central lever 21. The brackets 37A and 37B are connected thereto the lower ends of the side levers 11A and 11B through links 39, respectively. The bracket 38 is connected thereto the lower end of the central lever 21 through a link 40.

Now, the manner of operation of the lead wire cutting and bending device constructed in the manner as described above will be described with reference to the drawings.

Figure 8:
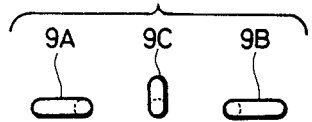
FIG. 8A is a bottom view showing lead wires outwardly bent.
FIG. 8B is a side view of the lead wires shown in FIG. 8A.
Figure 8:
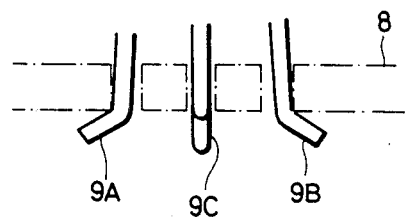

When the device receives the lead wires 9A, 9B and 9C at the state that the side levers 11A and 11B take such a posture as shown in FIG. 1, it carries out the outward bending of the lead wires. More particularly, the side brackets 37A and 37B are downward moved from the uppermost position shown in FIG. 1 by the action of the cylinder 33, so that the laterally movable blade members 12 of the side levers 11A and 11B are laterally slided on the surface of the stationary blade 3 in the direction spaced from each other, to thereby cut the lead wires 9A and 9B and outward bend the remaining portion of each of the wires as shown in FIGS. 8A and 8B. Concurrently, the central bracket 38 for the central lever 21 is downwardly moved from the uppermost position by the action of the cylinder 33 to turn the central lever 21 in the right direction, to thereby allow the central movable blade member 22 to cut the lead wire 9C and bend the remaining portion thereof.

Figure 4:
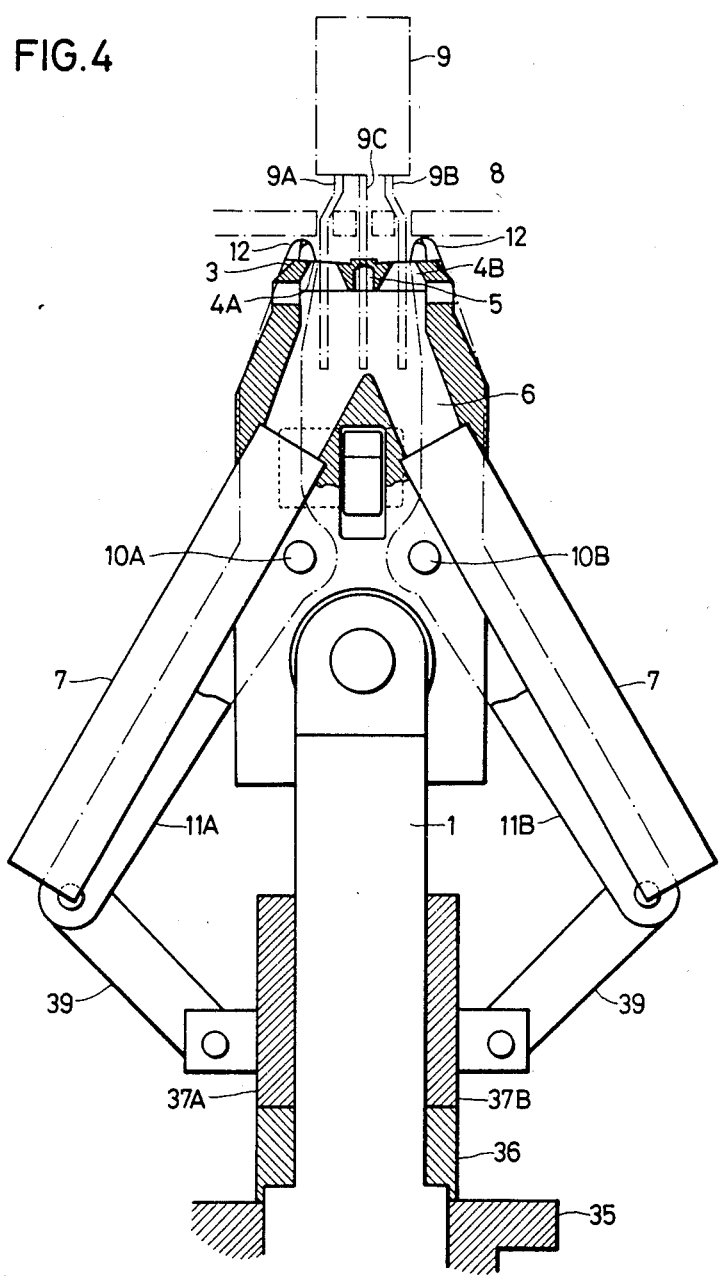
FIG. 4 is a front elevation view partly in section of the device shown in FIG. 1 wherein the side levers take a position of carrying out the inward bending of lead wires.
Figure 5:
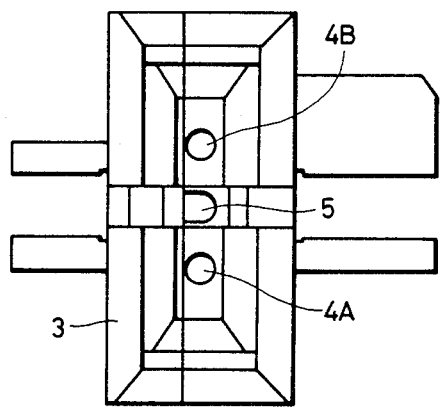
FIG. 5 is a plan view showing a stationary blade.
Figure 9:
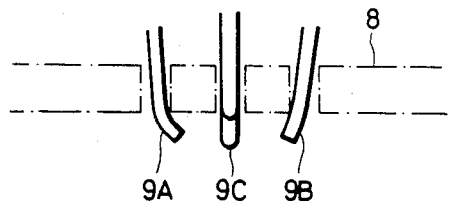
FIG. 9 is a schematic view showing lead wires inwardly bent.

When the device receives the lead wires 9A, 9B and 9C of the electronic circuit element 9 mounted on the printed circuit board 8 at the state that the side levers 11A and 11B take such a posture as shown in FIG. 4, it carries out the inward bending of the lead wires. More particularly, the brackets 37A and 37B are upwardly moved from the lowering position by the action of the cylinder 33, so that the laterally movable blade members 12 of the side levers 11A and 11B are slided on the surface of the stationary blade 3 in the direction approaching each other, to thereby cut the lead wires 9A and 9B and inward bend the remaining portions thereof as shown in FIG. 9. The central lever 21 is operated in the same manner as described above.

As can be seen from the foregoing, the illustrated embodiment includes the stationary blade 3 having the side holes 4A and 4B and the central hole 5 formed therethrough; a pair of the side levers 11A and 11B being slidable on the surface of the stationary blade 3 along a row of the holes 4A, 4B and 5; and the central lever 21 being slidable on the surface of the blade 3 in the direction across a row of the holes. Thus, it can effectively carry out the lead wire cutting and bending operation with respect to an electronic circuit element having three lead wires as well as that having two lead wires.

Also, the embodiment illustrated can accomplish any of the outward and inward bending of lead wires as desired by selecting desired posture of the side levers 11A and 11B.

Furthermore, the embodiment can carry out the lead wire cutting and bending operation with good reliability, because the side levers 11A and 11B and central lever 21 are actuated by means of a linkage. The actuation utilizing a cam mechanism would cause the deterioration and/or damage of a spring.

It will be obvious to those skilled in the art that the mechanism for actuating the main shaft 1, the brackets 37A and 37B for the side levers, and the bracket 38 for the central lever may be suitably varied.

Thus, it will be noted that the present invention can effectively carry out the lead wire cutting and bending operation with respect to an electronic circuit element having three lead wires as well as that having two lead wires.

It will thus be seen that the objects set forth above, among those made apparent from the preceding description, are efficiently attained and, since certain changes may be made in the above construction without departing from the spirit and scope of the invention, it is intended that all matters contained in the above description and shown in the accompanying drawings shall be interpreted as illustrative and not in a limiting sense. It is also to be understood that the following claims are intended to cover all of the generic and specific features of the invention herein described, and all statements of the scope of the invention which, as a matter of language, might be said to fall therebetween.

We claim:

1. A device for cutting and bending lead wires, comprising:

a linearly reciprocable main shaft;

a fixed block fixedly mounted on said main shaft, said fixed block having side surfaces, a distal end and a stationary blade provided at said distal end;

said stationary blade having two side holes and a central hole interposed between said side holes formed therethrough;

a pair of side levers slidably connected at one end thereof to said main shaft so as to be slidable with respect to said main shaft, said side levers being respectively pivotally mounted on both of said surfaces of said fixed block, said side levers each having a laterally movable blade member provided at the other end thereof and which is slidable on the surface of said stationary blade in a direction along a row of said holes to cut and bend lead wires inserted through said side holes of said stationary blade; and a central lever slidably connected at one end thereof to said main shaft so as to be slidable with respect to said main shaft, said central lever being pivotally mounted on a surface of said fixed block perpendicular to said side surfaces thereof on which said side levers are mounted, and said central lever having a central movable blade member provided at the other end thereof which is slidable on the surface of said stationary blade in a direction across said row of said holes to cut and bend a lead wire inserted thorough said central hole of said stationary blade.

2. A device for cutting and bending lead wires as defined in claim 1, comprising a linkage slidably mounted on said main shaft, said levers being connected to said main shaft through said linkage.

3. A device for cutting and bending lead wires as defined in claim 1, wherein said fixed block has a hollow passage means formed therethrough, said hollow passage means being connected at one end thereof with said side and central holes of said stationary blade and being connected at the other end thereof with a pipe for discharging lead wire chips to the exterior.

4. A device for cutting and bending lead wires as defined in claim 1, wherein said fixed block has lateral holes formed at both sides thereof, said lateral holes being communicated with said side and central holes, and said lateral holes each having inserted thereinto a detecting terminal means which is adapted to contact with a lead wire to confirm it.

5. A device for cutting and bending lead wires as defined in claim 1 wherein said central movable blade member is slideable in a direction substantially perpendicular to the slideable direction of said laterally moveable blade members.

* * * * *

UNITED STATES PATENT AND TRADEMARK OFFICE
CERTIFICATE OF CORRECTION

PATENT NO. : 4,586,544
DATED : May 6, 1986
INVENTOR(S) : H. YAGI et al

It is certified that error appears in the above-identified patent and that said Letters Patent is hereby corrected as shown below:

Column 6, line 6 (claim 1), change "thorugh"

to --through--.

Signed and Sealed this

Twenty-sixth Day of August 1986

[SEAL]

Attest:

Attesting Officer

DONALD J. QUIGG

Commissioner of Patents and Trademarks